United States Patent
Park

(10) Patent No.: US 8,110,507 B2
(45) Date of Patent: Feb. 7, 2012

(54) METHOD FOR PATTERNING AN ACTIVE REGION IN A SEMICONDUCTOR DEVICE USING A SPACE PATTERNING PROCESS

(75) Inventor: Chan Ha Park, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 537 days.

(21) Appl. No.: 12/331,669

(22) Filed: Dec. 10, 2008

(65) Prior Publication Data

US 2009/0317979 A1    Dec. 24, 2009

(30) Foreign Application Priority Data

Jun. 20, 2008    (KR) .................. 10-2008-0058490

(51) Int. Cl.
*H01L 21/302* (2006.01)
(52) U.S. Cl. .................. 438/738; 438/700; 438/735
(58) Field of Classification Search .................. 438/595, 438/700, 712, 714, 735, 696, 738; 430/302, 430/310
See application file for complete search history.

(56) References Cited

U.S. PATENT DOCUMENTS

| 6,723,607 | B2 * | 4/2004 | Nam et al. ..................... 438/275 |
| 7,795,080 | B2 * | 9/2010 | Orimoto et al. ............... 438/129 |
| 2002/0197823 | A1 * | 12/2002 | Yoo et al. ...................... 438/424 |
| 2004/0119167 | A1 | 6/2004 | Suk |
| 2005/0215040 | A1 * | 9/2005 | Doyle ........................... 438/585 |
| 2006/0197177 | A1 | 9/2006 | Yeom |
| 2007/0246783 | A1 | 10/2007 | Moon et al. |

FOREIGN PATENT DOCUMENTS

| KR | 10-0723527 | 5/2007 |
| KR | 10-2009-0042458 | 4/2009 |
| KR | 10-2009-0047001 | 5/2009 |

* cited by examiner

*Primary Examiner* — Lan Vinh
(74) *Attorney, Agent, or Firm* — Marshall, Gerstein & Borun LLP

(57) ABSTRACT

Disclosed here in is a method for patterning an active region in a semiconductor device using a space patterning process that includes forming a partition pattern having partition pattern elements arranged in a square shape on a semiconductor substrate; forming a spacer on side walls of the partition pattern; removing the partition pattern; separating the spacer into first and second spacer portions to expose a portion of the semiconductor substrate; and etching the exposed portion of the semiconductor substrate to form a trench, wherein portions of the semiconductor substrate overlapped with the first and second spacer portions define an active region.

9 Claims, 10 Drawing Sheets

METHOD FOR PATTERNING AN ACTIVE REGION IN A SEMICONDUCTOR DEVICE USING A SPACE PATTERNING PROCESS

CROSS-REFERENCE TO RELATED APPLICATIONS

Priority to Korean patent application No. 10-2008-0058490, filed on Jun. 20, 2008, the disclosure of which is incorporated herein by reference in its entirety, is claimed.

BACKGROUND OF THE INVENTION

1. Field of the Invention

The invention relates to a semiconductor device, and more particularly, to a method for patterning an active region in a semiconductor device using a space patterning process.

2. Brief Description of Related Technology

As the degree of integration of a semiconductor device increases and a design-rule is reduced, a fine pattern size is required. However, pattern size limits of optical exposure apparatuses required for forming the fine pattern make it difficult to reduce the design-rule. A maximum numeral aperture (NA) for conventional optical exposure machines is about 1.35. The limit of resolution is about 40 nm, based on a half pitch, when an ArF laser is used as a light source. As a result, it is difficult to implement a single exposure using a cell structure, such as $8F^2$ or $6F^2$ at a resolution of 40 nm or less. Thus, in order to form the fine pattern, a double patterning method is used. When using the double patterning method, an overlay of the pattern elements must be made zero such that the pattern elements are separate and distinct. However, t it is difficult to make the overlay of the pattern elements zero and make the size of the pattern elements constant.

FIG. 1 is a view showing the $8F^2$ cell structure of a general DRAM device. FIG. 2 is a view showing the $4F^2$ cell structure of the DRAM device. FIGS. 3a and 3b are views explaining problems caused when the $4F^2$ cell structure of FIG. 2 is formed in an actual pattern.

Referring to FIG. 1, a pattern 100 represents an active region, $F^2$ represents a unit region of a cell storing 1 bit, and F represents one minimum pitch. An area of a unit structure including four capacitors can be represented by $8F^2$. As the design-rule is reduced, fidelity of the pattern 100 defining the active region is reduced. The finest pattern formable by a conventional, commercially available device is a simple line and space pattern of about 40 nm, using a resolution enhancement technique (RET). However, when the pattern shape is a two-dimensional shape as shown in FIG. 1, a limit of an allowable design is forced to be large. Since it is difficult to progress the fineness of the pattern using the conventional, commercially available device, a different type of cell design has been proposed.

FIG. 2 shows a proposed type of cell design, the $4F^2$ cell structure. A pattern 200 represents an active region. The cell area of the $4F^2$ cell structure can be theoretically reduced to half the cell area of the $8F^2$ cell structure. As shown in FIG. 3a, however, a pattern 300 shape implemented when the $4F^2$ cell structure is substantially formed on a wafer is represented by a circle. Even in this case, it is difficult to guarantee uniformity between patterns because of a defect of resolution. The current exposure apparatus cannot sufficiently transfer diffraction information by a mask pattern because an interval between the patterns is too narrow. Referring to FIGS. 3a and 3b, when the pattern is implemented on a wafer in a 50 nm-grade $4F^2$ structure, an irregular pattern bridge 305 can be formed as a result of contrast degradation. Therefore, a need exists for a method of forming the active area that can implement many memory cells within a small area and a pattern in a stable shape.

SUMMARY OF THE INVENTION

In accordance with an embodiment of the invention, a method for patterning an active region in a semiconductor device using a space patterning process includes: forming a partition pattern having partition pattern elements arranged in a square shape on a semiconductor substrate; forming a spacer on side walls in the partition pattern elements; removing the partition pattern; separating the spacer into first and second spacer portions to expose a portion of the semiconductor substrate; and etching the exposed portion of the semiconductor substrate to form a trench, wherein a portion of the semiconductor substrate overlapped with the first and second spacer portions defines an active region.

Elements of the partition pattern can be formed, for example, to have a rectangular or diamond shape, with any one direction longer than another direction.

The partition pattern elements are preferably arranged so that lines connecting the partition pattern elements form zigzags, and the partition pattern is formed in a square shape. The partition pattern preferably has a length of about 50 nm and a width of about 75 nm, when a pitch of the active region is set to about 75 nm in size.

The method can include forming the spacer by depositing a spacer layer covering the partition pattern so that the spacer has a line width in a range of 15 nm to 25 nm; and exposing an upper surface of the partition pattern by anisotropically etching the spacer layer to form the spacer.

The spacer preferably has the same etch selectivity as the partition pattern. The partition pattern is preferably removed by a wet etching. The spacer preferably remains in a square ring shape after removal of the partition pattern.

The method can include separating the spacer by forming a mask pattern including an opening having a line shape that is extended across a middle portion of the spacer to expose the middle portion of the spacer; and selectively etching and removing the exposed spacer portion.

The method of the invention can further include selectively removing the first and second spacer portions; removing remnants of the removed first and second spacer portions from an upper portion of the semiconductor substrate by a cleaning process; and forming an insulating layer to fill the trench.

DESCRIPTION OF SPECIFIC EMBODIMENTS

In a conventional $8F^2$ cell structure, it is difficult to maintain resolution as a design-rule is reduced. Even in a $4F^2$ cell structure, the ability to implement a mask pattern on a wafer is degraded when the design-rule is a predetermined size or less. Therefore, the invention provides a method that can increase the resolution of a pattern.

Figure 4A:
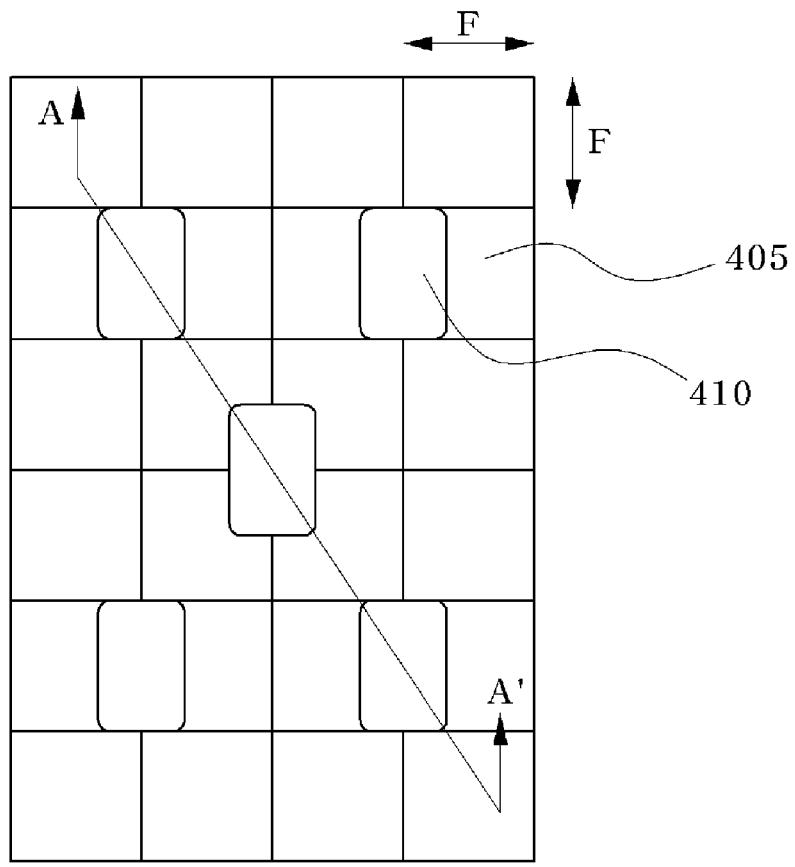
FIGS. 4a to 11b are views showing a method for patterning an active region of a semiconductor device by using a space patterning process according to an embodiment of the invention.
Figure 4B:
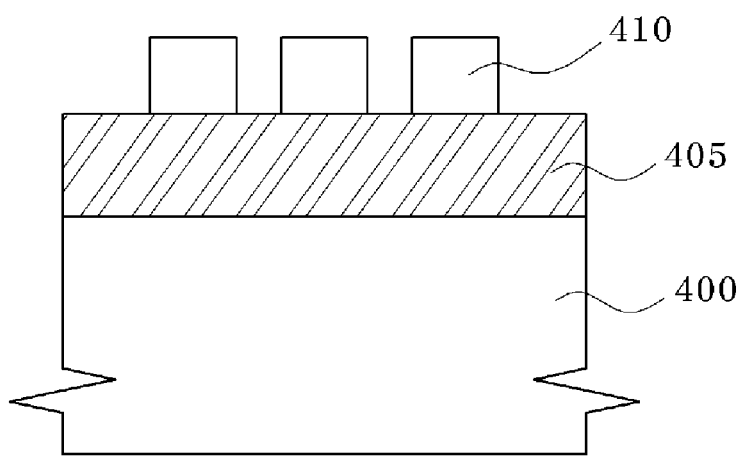

Referring to FIGS. 4a and 4b, a sacrifice layer 405 is formed on a semiconductor substrate 400. The sacrifice layer 405 defines a region in which a target pattern will be formed using a space patterning technique (SPT). The sacrifice layer 405 can be formed, for example, of an oxide layer. Next, a first mask pattern 410 is formed on the sacrifice layer 405. Preferably, the first mask pattern 410 is formed by forming a resist layer on the sacrifice layer 405. Subsequently, an exposure process irradiating light on a resist layer is performed. Physical properties of the resist layer are changed according exposure to the irradiating light. The first mask pattern 410, which selectively exposes the sacrifice layer 405, is formed by performing a development process on the resist layer to selectively remove a portion of the resist layer whose physical properties are changed by exposure to the irradiating light. $F^2$ is a unit area of a cell storing 1 bit and F is a minimum feature size in a line end space pattern. Referring back to FIG. 4a, the first mask pattern 410 is preferably formed in a square shape. The first mask pattern preferably has a length of about 50 nm and a width of about 75 nm, when a minimum feature size F is set to about 75 nm. It is exemplary that elements of the first mask pattern 410 are formed in a rectangular shape where a length of a portion of the pattern is relatively longer than a length of the other portion. Also, the first mask pattern 410 elements can be formed to have a diamond shape. In the rectangular first mask pattern 410 elements, a portion having a long length is a major axis of the first mask pattern 410 and a portion having a short length is a minor axis of the first mask pattern 410. FIG. 4b is a view showing a cross section taken along a diagonal direction A-A'. Further, the figures define the feature size F as a lattice shape, but the lattice shape is not actually formed in an actual pattern.

Figure 1:
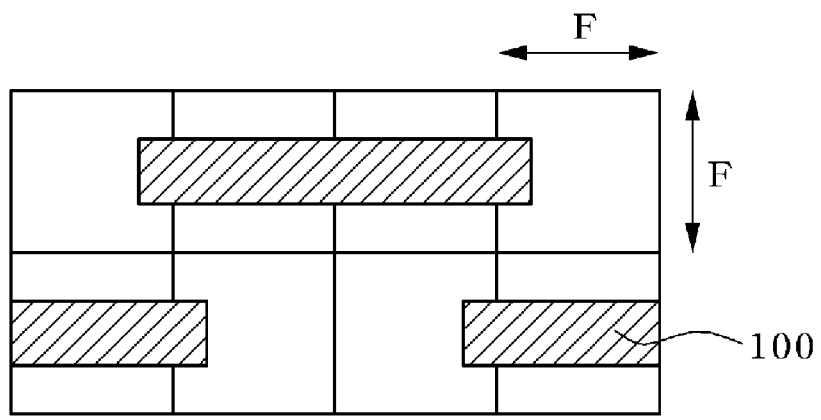
FIG. 1 is a view showing a conventional $8F^2$ cell structure of a DRAM device.
Figure 2:
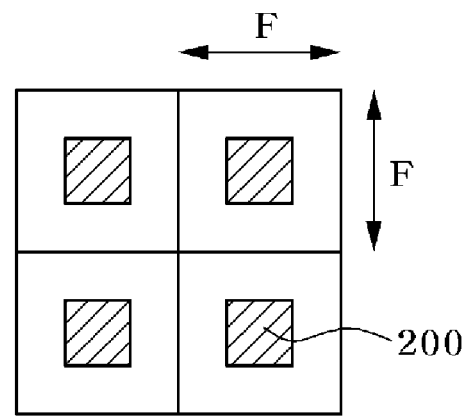
FIG. 2 is a view showing a conventional $4F^2$ cell structure of a DRAM device.
Figure 3A:
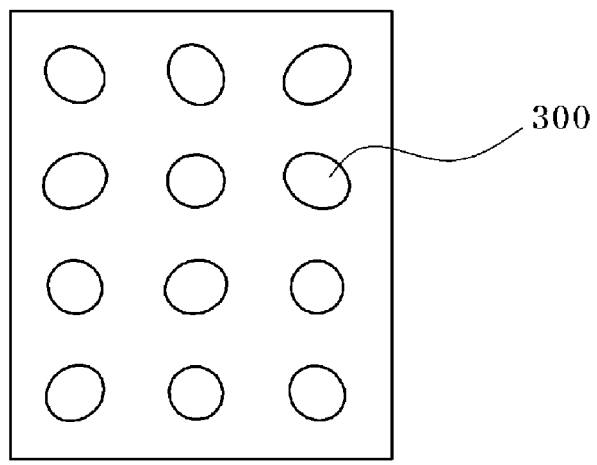
FIGS. 3a and 3b are views showing problems caused when the $4F^2$ cell structure of FIG. 2 is formed in an actual pattern by conventional exposure machines.
Figure 3B:
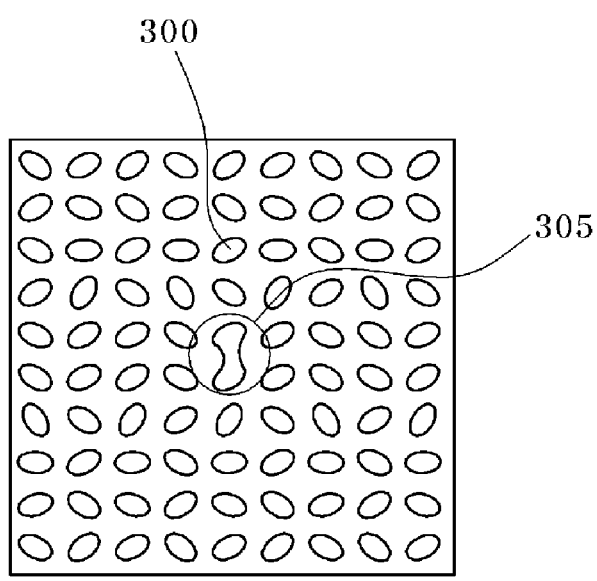
Figure 5A:
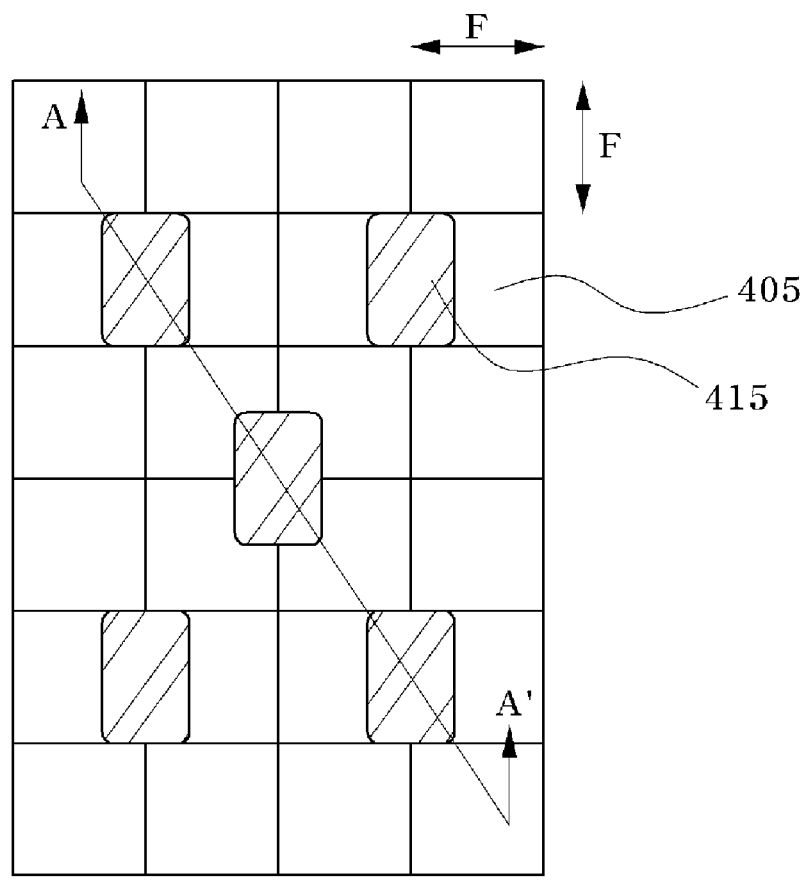
Figure 5B:
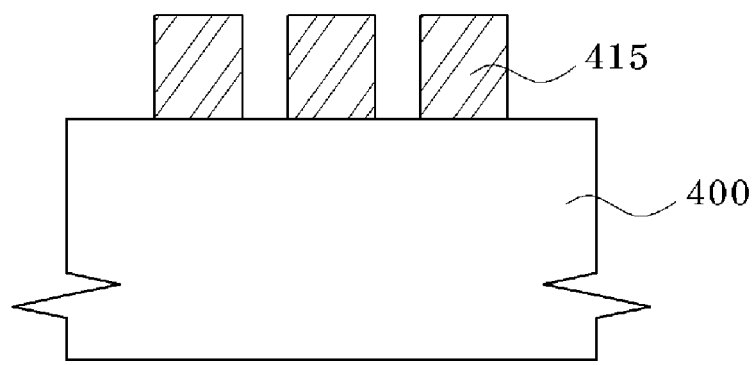

Referring to FIGS. 5a and 5b, the exposed portion of the sacrifice layer 405 (see FIG. 4a) is etched using the first mask pattern 410 as an etch mask to form a partition pattern 415. The partition pattern 415 designates a position of a target pattern to be subsequently formed, and exposes a portion of a surface of the semiconductor substrate 100. Preferably, the partition pattern 415 is formed having partition pattern 415 elements arranged in a square shape. When a partition pattern 415 element is formed into a rectangular or diamond shape, the size of the chip can be reduced, and further, a number of partition pattern elements can be formed within a limited space. The partition pattern 415 elements preferably have a length of about 50 nm and a width of about 75 nm, when a minimum feature size F is set to about 75 nm. The partition pattern 415 elements can be formed, for example, to have a rectangular or diamond shape, whose any one direction is longer than other directions. The partition pattern 415 elements are preferably arranged so that lines connecting the partition pattern 415 elements form zigzags. The partition pattern 415 forms to be larger than the patterns 100 and 200 of the conventional $8F^2$ or $4F^2$ cell structures shown in FIGS. 1 and 2, making it possible to increase the resolution of the pattern.

Figure 6A:
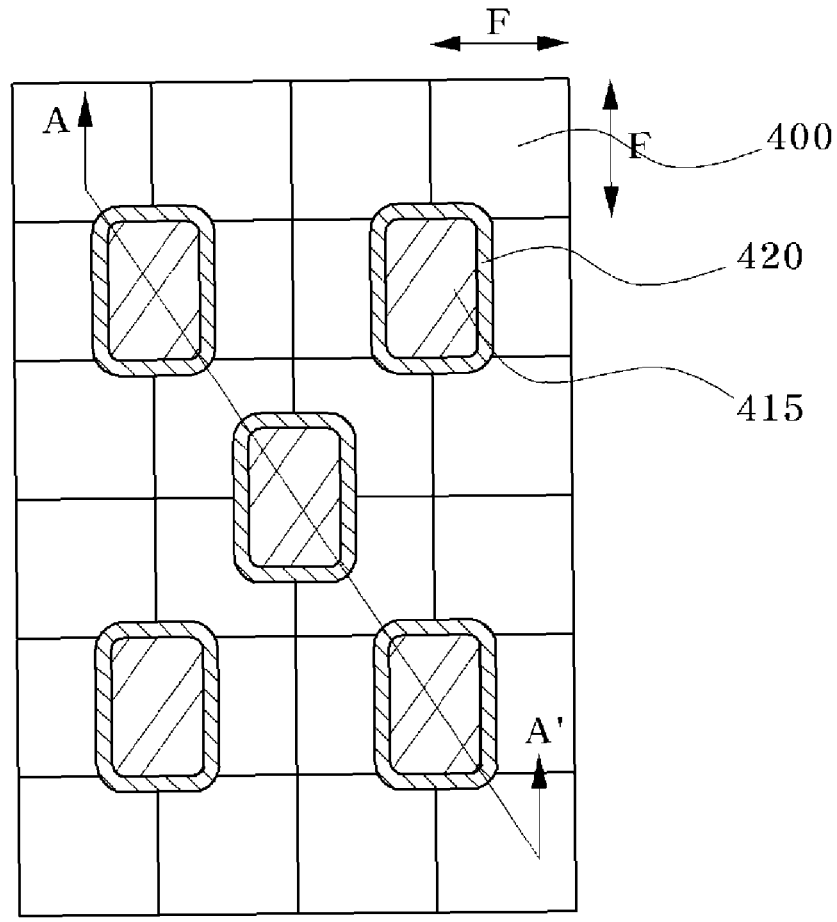
Figure 6B:
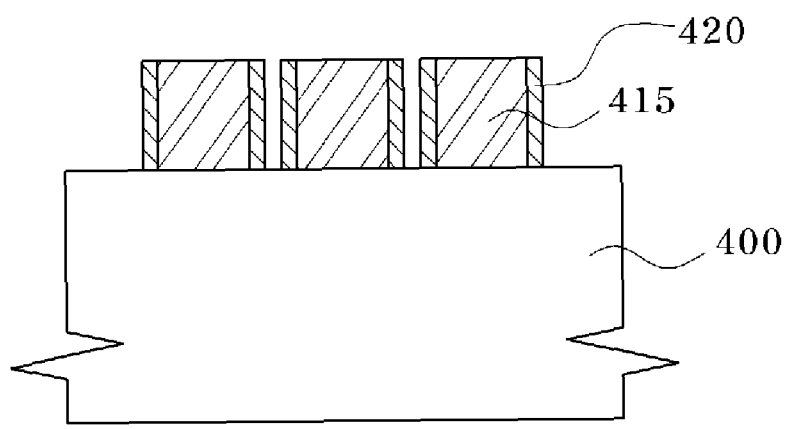
Figure 7A:
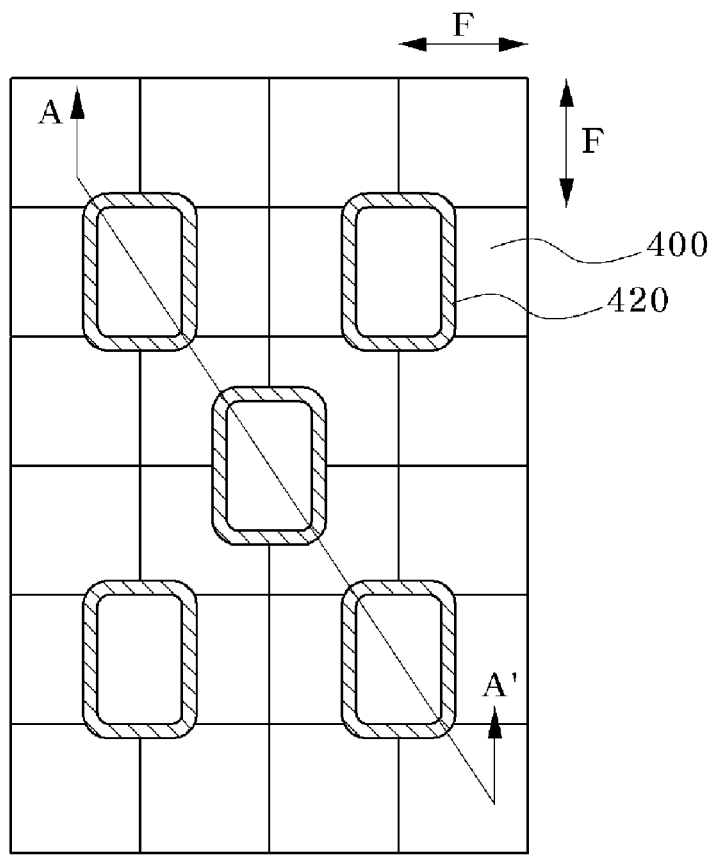
Figure 7B:
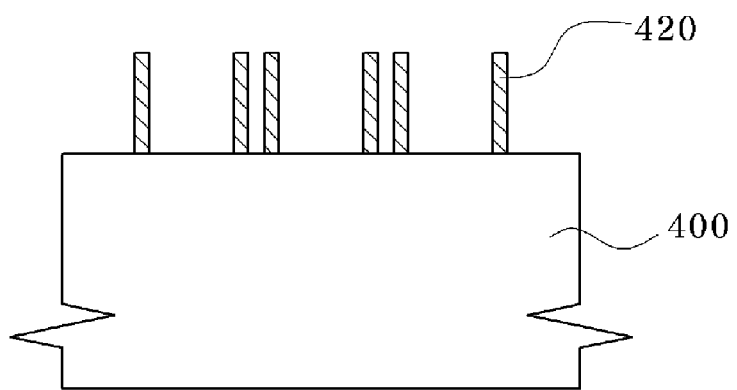

Referring to FIGS. 6a and 6b, a spacer 420 is disposed on side walls of the partition pattern 415. Preferably, a spacer layer is formed on the partition pattern 415 and the semiconductor substrate 400. The spacer layer can be formed, for example, of a nitride based insulating layer having the same etch selectivity as the partition pattern 415. For example, the spacer layer can be formed of a silicon nitride ($Si_3N_4$) layer. The spacer layer can also be formed, for example, of a polysilicon layer. A portion of the spacer layer disposed on an upper portion of the partition pattern 415 and the semiconductor substrate 400 is removed, for example, by an anisotropic etching. Then, the spacer 420 is formed on the side walls of the partition pattern 415. Referring to FIG. 6a, the spacer 420 is preferably formed surrounding each surface of the partition pattern 415, for example, in a ring shape. The spacer 420 is preferably formed at the same thickness as a width of the active region to be subsequently formed. For example, the spacer 420 can be formed at a thickness in a range of 15 nm to 25 nm, projecting from each exposed surface of the partition pattern 415. Therefore, the spacer 415 has a line width in a range of 15 nm to 25 nm. Preferably, the spacer 420 is formed around one partition pattern 415 element so as not to contact a spacer 420 formed on another partition pattern 415 element, adjacently arranged in a diagonal direction. The spacer 420 can be formed, for example, by performing an etch back process, but the invention is not limited to the etch back process Referring to FIGS. 7a and 7b, an etching process, which removes the partition pattern 415, is performed to expose a portion of the spacer 420. A vertical profile side surface of the spacer 420 is exposed. The partition pattern 415 can be removed, for example, by supplying a wet etching solution chemically dissolving the partition pattern 415. Since the partition pattern 415 has a different etch ratio than the spacer 420, only the partition pattern 415 is selectively removed. As shown in FIG. 7a, the spacer 420 having the ring shape remains on the semiconductor substrate 400 after the etching process.

Figure 8A:
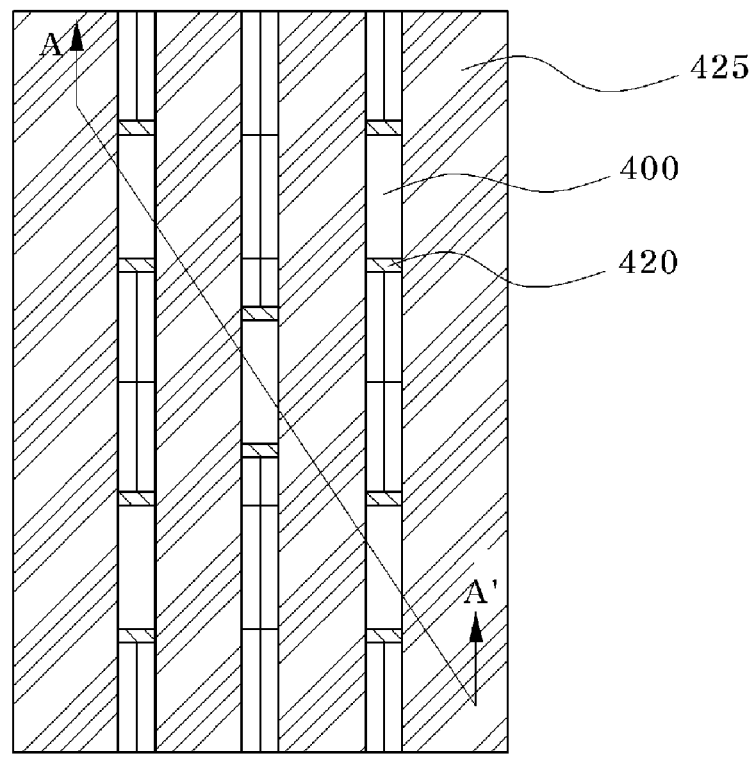
Figure 8B:
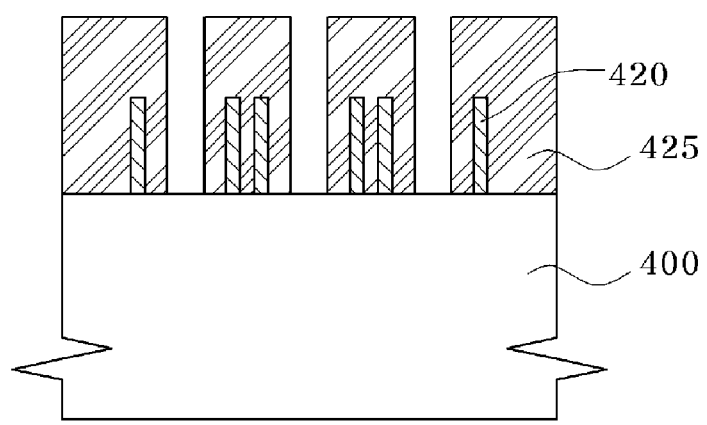

Referring to FIGS. 8a and 8b, a second mask pattern 425, which selectively exposes a portion of the spacer 420, is formed on the semiconductor substrate 400. Preferably, the second mask pattern 425 is formed by forming a resist layer on the semiconductor substrate. An exposures irradiating light on the resist layer is performed. The physical properties of the resist layer are then changed by exposure to the irradiating light. Next, the second mask pattern 425 selectively exposing the spacer 420 is formed by performing a development process on the resist layer to selectively removing a portion of the resist layer whose physical properties are changed by exposure to the irradiating light. As shown in FIG. 8a, the second mask pattern 425 includes an opening having a line shape that is extended across a middle portion of the spacer 420. The second mask pattern 425 exposes a portion of a minor axis of the spacer 420.

Figure 9A:
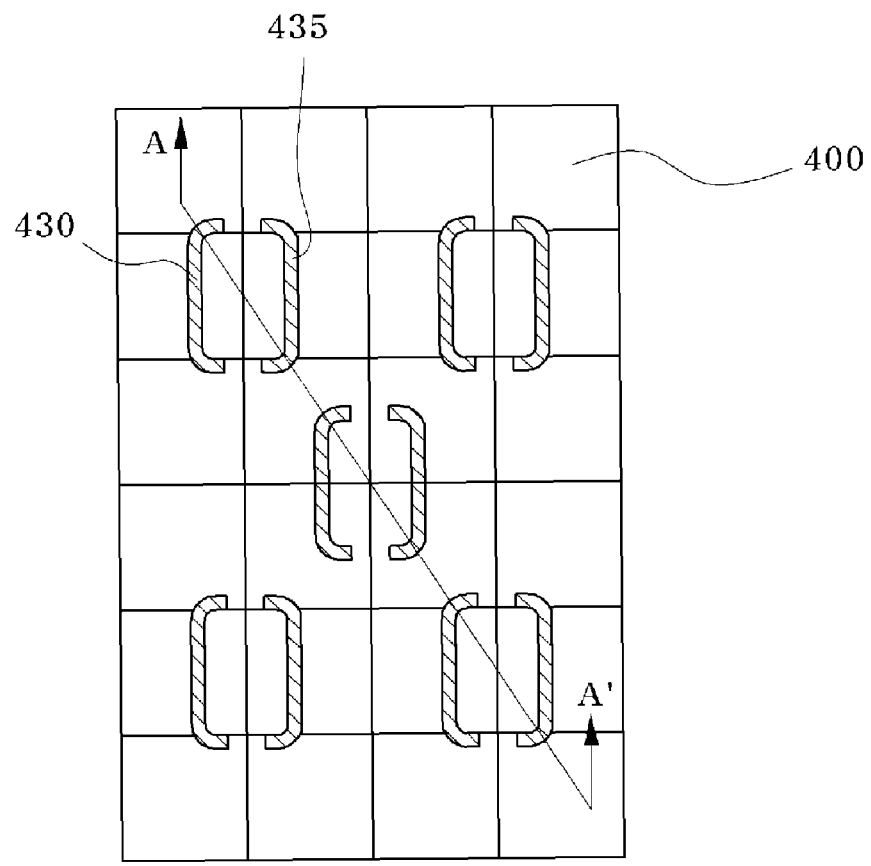
Figure 9B:
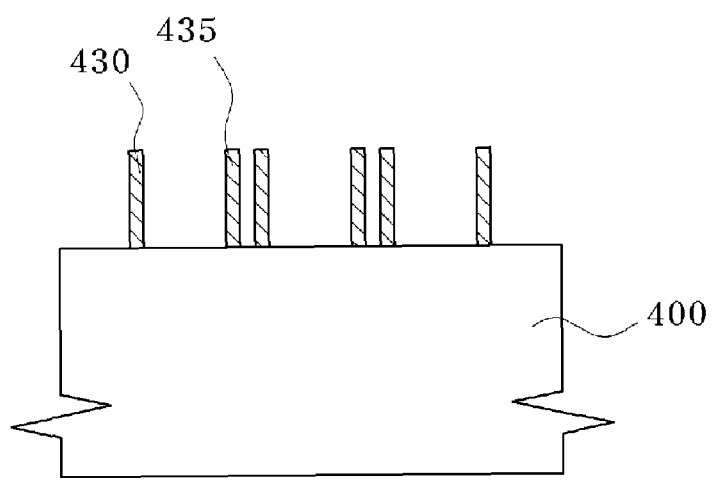

Referring to FIGS. 9a and 9b, the exposed portion of the spacer 420 is selectively etched using the second mask pattern 425 as the etch mask. The spacer 420 is separated into two portions, a first spacer 430 and a second spacer 435. The first spacer 430 and the second spacer 435 defining a portion in which the active region will be formed. The second spacer 435 is preferably arranged as a mirror image of the first spacer 430, and spaced by a predetermined distance from the first space 430. The second mask pattern 425 can be removed, for example, by performing a strip process.

Figure 10A:
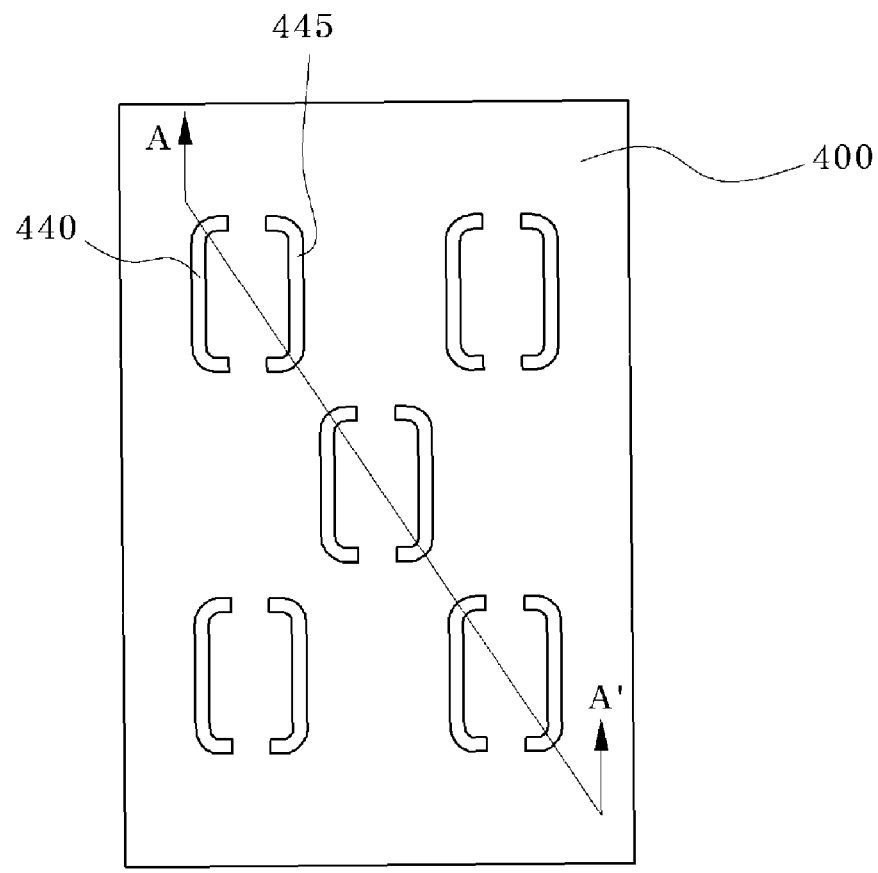
Figure 10B:
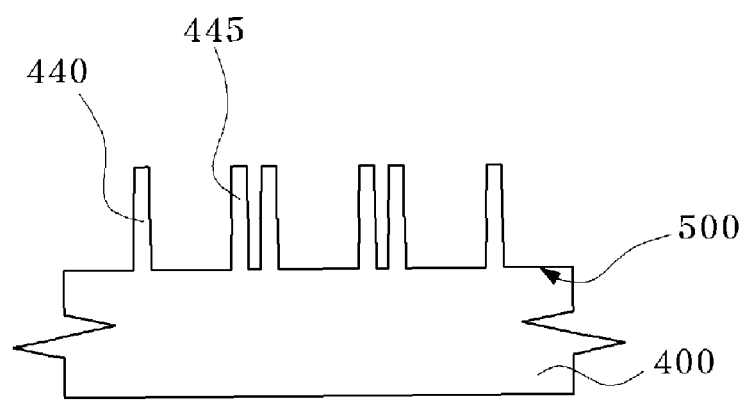

Referring to FIGS. 10a and 10b, the exposed portion of the semiconductor substrate 400 is etched to a predetermined depth using the first spacer 430 and the second spacer 435 as the etch mask. The portions of the semiconductor substrate 400 overlapped with the first and second spacers 430 and 435 define the active regions. The first and second spacers 430 and 435 are removed, and the remnants of the spacer are removed by performing a cleaning process. Then, a trench 500 for isolating a device is formed, which defines the first and second active regions 440, 445 on the semiconductor substrate 400. The first and second active regions 440, 445 are arranged to be spaced by a predetermined distance and have a mirror image structure. The first and second active regions 440 and 445 are established as a unit cell region that includes two capacitors in the first active region 440 and two capacitors in the second active region 445. An area of the unit cell region is formed as $1.75F^2$, when the minimum feature F size is 75 nm. When it uses the double patterning method to form the fine pattern, it is difficult to make the overlay of the pattern elements zero such that the pattern elements are separate and distinct, and further it is difficult to make the size of the pattern elements constant. In this connection, when using the method of the invention to form the first active region 440 and the second active region 445, it can be easier to make the overlay of the pattern elements zero, such that the pattern elements are separate and distinct. Further, it can be possible to make the size of the pattern elements constant.

Figure 11A:
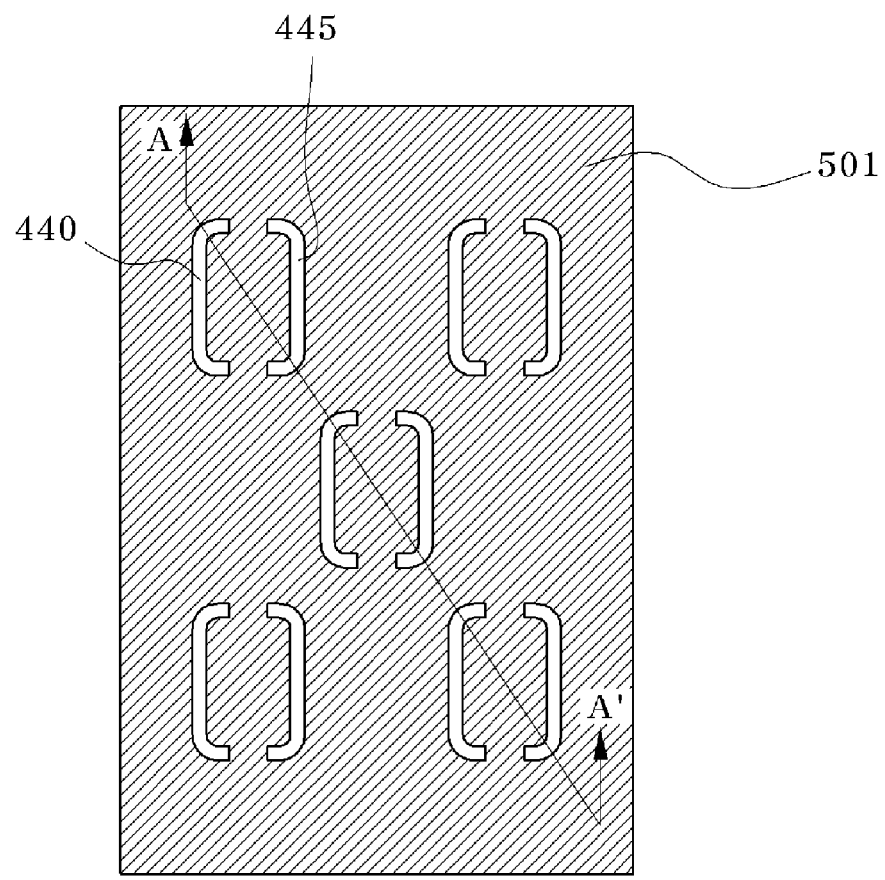
Figure 11B:
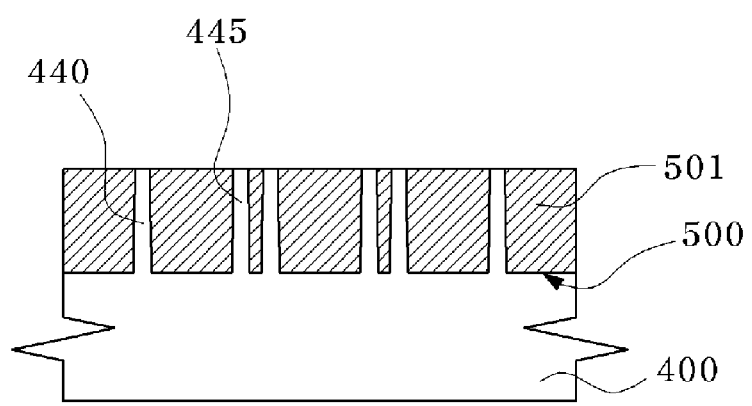

Referring to FIGS. 11a and 11b, an insulating layer 502, which fills the trench 500 for isolating the device, is formed on the semiconductor substrate 400.

The method for patterning the active region of the semiconductor device using the space patterning process according to the invention can form the active region in a stable form within an area as small as possible by first forming the pattern and then using the space patterning process and the separation process.

While the invention has been described with respect to the specific embodiments, it will be apparent to those skilled in the art that various changes and modifications may be made without departing from the spirit and scope of the invention as defined in the following claims.

What is claimed is:

1. A method for patterning an active region in a semiconductor device using a space patterning process, the method comprising:
    forming a partition pattern comprising partition pattern elements arranged in a square shape over a semiconductor substrate;
    forming a spacer having an etch selectivity the same as an etch selectivity of the partition pattern on side walls of each of the partition pattern elements;
    removing the partition pattern;
    separating the spacer into first and second spacer portions to expose a portion of the semiconductor substrate; and
    etching the exposed portion of the semiconductor substrate to form a trench and define an active region.

2. The method of claim 1, wherein each partition pattern element has a rectangular or diamond shape, wherein one direction is longer than another direction.

3. The method of claim 1, wherein the partition pattern elements are arranged so that lines connecting the partition pattern elements form zigzags.

4. The method of claim 1, wherein the partition pattern is formed in a square shape having a length of about 50 nm and a width of about 75 nm when a pitch of the active region is set to about 75 nm in size.

5. The method of claim 1, wherein forming the spacer comprises:
    depositing a spacer layer to cover the partition pattern so that the spacer has a line width in a range of 15 nm to 25 nm; and
    exposing an upper surface of the partition pattern by anisotropically etching the spacer layer to form the spacer.

6. The method of claim 1, comprising removing the partition pattern by a wet etching.

7. The method of claim 1, wherein the spacer has a square ring shape after removing the partition pattern.

8. The method of claim 1, wherein separating the spacer comprises:
    forming a mask pattern including an opening having a line shape that extends across a middle portion of the spacer and exposes a portion of the spacer; and
    selectively etching and removing the spacer portion exposed by the mask pattern.

9. The method of claim 1, further comprising:
    selectively removing the first and second spacer portions;
    cleaning an upper portion of the semiconductor substrate; and
    forming an insulating layer so as to fill the trench.

* * * * *